United States Patent
Ahn et al.

(10) Patent No.: US 10,465,868 B2
(45) Date of Patent: Nov. 5, 2019

(54) JIG FOR SAMPLE FOR SOLAR PHOTOVOLTAIC DEVICE AND SOLAR SIMULATOR INCLUDING THE SAME

(71) Applicant: KOREA INSTITUTE OF ENERGY RESEARCH, Daejeon (KR)

(72) Inventors: Seung-kyu Ahn, Daejeon (KR); Jun-sik Cho, Daejeon (KR); Jae-ho Yun, Daejeon (KR); Se-jin Ahn, Daejeon (KR); Jihye Gwak, Daejeon (KR); Jin-su Yoo, Daejeon (KR); Joo-hyung Park, Daejeon (KR); Young-joo Eo, Daejeon (KR); Ara Cho, Daejeon (KR); Kihwan Kim, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 199 days.

(21) Appl. No.: 15/788,049

(22) Filed: Oct. 19, 2017

(65) Prior Publication Data
US 2018/0106440 A1 Apr. 19, 2018

(30) Foreign Application Priority Data
Oct. 19, 2016 (KR) .................... 10-2016-0135948

(51) Int. Cl.
*H02S 50/10* (2014.01)
*F21S 8/00* (2006.01)
*G01R 1/04* (2006.01)
*G01R 1/073* (2006.01)

(52) U.S. Cl.
CPC ............ *F21S 8/006* (2013.01); *G01R 1/0416* (2013.01); *G01R 1/07307* (2013.01); *H02S 50/10* (2014.12)

(58) Field of Classification Search
CPC .... F21S 8/00; F21S 8/006; G01R 1/04; G01R 1/0416; G01R 1/073; G01R 1/07307; G01R 31/26; H02S 50/10
See application file for complete search history.

(56) References Cited

U.S. PATENT DOCUMENTS

| 8,570,048 B2* | 10/2013 | Lee ................. G01R 31/001 248/441.1 |
| 2011/0012635 A1* | 1/2011 | Lu ........................ H02S 50/10 324/757.03 |

FOREIGN PATENT DOCUMENTS

| CN | 106357218 A * | 1/2017 |
| JP | 5362379 B2 | 12/2013 |
| KR | 200455080 Y1 | 8/2011 |

(Continued)

*Primary Examiner* — Son T Le
(74) *Attorney, Agent, or Firm* — Cantor Colburn LLP (57) ABSTRACT

A jig for a sample for a solar photovoltaic device is disclosed. The jig includes a cradle unit supporting the sample and a contact unit including at least one probe pin coming into contact with a busbar of the sample located in the cradle unit. The contact unit includes a coupling plate coupled with the cradle unit and at least one contact bar including a PCB and connected to the coupling plate, the contact bar having at least one probe pin aligned with the busbar of the sample with interposition of a probe pin connecting block. the jig includes a rotation support unit coupled with the cradle unit by a rotation shaft to allow the cradle unit to be rotated at an angle of 180° or greater so that upper and lower surfaces of the sample supported by the cradle unit are reversed.

13 Claims, 8 Drawing Sheets

(56) References Cited

FOREIGN PATENT DOCUMENTS

| KR | 1020120096832 A | 8/2012 |
|----|-----------------|--------|
| KR | 101213059 B1 | 12/2012 |
| KR | 1020140012229 A | 2/2014 |
| KR | 1020140109634 A | 9/2014 |
| KR | 1020150139366 A | 12/2015 |
| KR | 20160052164 A | 5/2016 |
| KR | 1020160115780 A | 10/2016 |
| KR | 1020170071730 A | 6/2017 |

* cited by examiner

Fig. 8

JIG FOR SAMPLE FOR SOLAR PHOTOVOLTAIC DEVICE AND SOLAR SIMULATOR INCLUDING THE SAME

CROSS-REFERENCE TO RELATED APPLICATION

This application claims the benefit of Korean Patent Application No. 10-2016-0135948, filed on Oct. 19, 2016 in the Korean Intellectual Property Office, the disclosures of which are incorporated herein by reference.

BACKGROUND OF THE INVENTION

This work was conducted under the framework of Research and Development Program of the Korea Institute of Energy Research (KIER) (B7-2421-01). This work was also supported by the Korea Institute of Energy Technology Evaluation and Planning (KETEP), granted financial resource from the Ministry of Trade, Industry & Energy, Republic of Korea (No. 20163010012430).

1. Technical Field

The present disclosure generally relates to a measuring jig for mounting a sample to measure performance and characteristics of a solar photovoltaic device. More particularly, the present disclosure relates to a measuring jig which can be rotated in a state where the sample is mounted and can precisely and easily align an electrode part of the sample with a probe pin.

2. Description of the Related Art

Recently, as conventional energy sources such as petroleum or coal are expected to be exhausted soon, interest in alternative renewable energy has increased. Among such alternatives, solar cells are highlighted as a new generation energy source that converts solar energy into electric energy. In such solar cells, various layers and electrodes can be manufactured according to design, and the efficiency of the solar cell can be determined depending on the design of the various layers and electrodes.

Whether the solar cell is provided with desired characteristics and efficiency can be determined by using various measuring devices. Out of these, a method of determining characteristics of the solar cell by using a measuring device to measure a current (I)—voltage (V) characteristic curve of the solar cell is widely used. Generally, a measuring device to measure a current (I)—voltage (V) characteristic curve of the solar cell includes a bar being extended along the length direction of the electrode of the solar cell. At the bar of the measuring device, a plurality of probe pins is spaced apart from each other at regular intervals along the length direction of the electrode of the solar cell. As the electrode of the solar cell includes a plurality of electrode sections, in the state that the plurality of probe pins mounted at each bar is arranged along the length direction of the electrode of the solar cell, the plurality of probe pins is located to contact the electrode section. Diode characteristics are measured by measuring current characteristics depending on a voltage by measuring a current generated due to the light incidence after allowing incident light to enter in this state, and by detecting a current from other pins after supplying a predetermined voltage to some of the pins.

A conventional measuring device like this has difficulties precisely aligning a plurality of pins to one electrode section and has drawbacks such that precise alignment of the electrode section and the pins of the measuring device may become more difficult when the current is measured for a solar cell having small width or pitch of the electrode section. To resolve such drawbacks, a technology related to a measuring device having a fine contact part has been studied (Korean Patent Application Publication No. 10-2016-0052164), but it still has a drawback in that it is difficult to be applied to various types of solar photovoltaic power devices and application scope thereof is thus limited.

SUMMARY OF THE INVENTION

In order to achieve the above object, a jig for the sample for a solar photovoltaic device according to the present disclosure includes: a cradle unit supporting the sample for the solar photovoltaic device; and a contact unit including at least one probe pin coming into contact with a busbar of the sample located at the cradle unit.

Meanwhile, the contact unit includes a coupling plate coupled with the cradle unit; and at least one contact bar composed of a PCB (Printed Circuit Board) and being connected to the coupling plate, the contact bar having the at least one probe pin arranged and fixed at the contact bar to be aligned with the busbar of the sample with interposition of at least one probe pin connecting block.

In addition, the jig further includes a rotation support unit coupled with the cradle unit by a rotation shaft so as to allow the cradle unit to be rotated at an angle equal to or greater than 180°, so that upper and lower surfaces of the sample supported by the cradle unit are reversed.

The present disclosure provides a jig equipped with a rotating structure which allows the rear surface of the sample to face upward by rotating the sample for a performance assessment of the solar photovoltaic device which generates electric power by receiving light through both of upper and lower surfaces. Accordingly, there is an effect to assess the performance without reinstalling the sample in the case the light is to be received through the rear surface, with respect to the solar photovoltaic device of the bifacial light receiving type.

At this time, when the contact unit is configured by including the upper contact portion coming into contact with the upper busbar of the sample and the lower contact portion coming into contact with the lower busbar of the sample, it may preferably appropriate for the performance measurement for the solar photovoltaic device of the bifacial light receiving type.

In addition, the contact unit of the present disclosure is configured to include a coupling plate coupled with the cradle unit, and a contact bar composed of a PCB and being connected to the coupling plate, the contact bar being provided with at least one probe pin. At this time, at least one probe pin is arranged and fixed at the contact bar to be aligned with the electrode part of the sample with interposition of at least one probe pin connecting block. Preferably, the probe pin connecting block is provided with a hole at one end thereof to allow the probe pin to be inserted thereinto, and a connection part at an opposite end thereof to be electrically connected with the contact bar. In addition, at the contact bar, at least one electric signal transmitting pad is installed to transmit a signal from the probe pin to a circuit of the contact bar composed of the PCB.

The present disclosure composed as described above allows a position of the probe pin to be adjusted by coupling the probe pin connecting block to a desired arbitrary location of the electric signal transmitting pad by soldering. In addition, as the present disclosure utilizes the PCB having a printed electric circuit as the contact bar to electrically connect the probe pin, there is an advantage that the contact bar can be manufactured thin, whereby influence of shade occurring during the performance measurement of the sample can be minimized and the structure becomes simple because electric wire is not necessary for the electric connection.

In addition, the contact bar of the present disclosure may be configured such that at a front surface of the contact bar, at least one first electric signal transmitting pad is provided and at a back surface thereof, at least one second electric signal transmitting pad is provided. At this time, the first electric signal transmitting pad may receive a first signal of the sample output from the probe pin connected thereto and transmits the signal to the circuit of the front surface, and the second electric signal transmitting pad may receive a second signal which is output from the probe pin connected thereto and is an electric signal different from the first signal, and transmits the second signal to a circuit of the back surface. Here, the first signal and the second signal each may be a current signal or a voltage signal.

In addition, the cradle unit of the present disclosure is configured by including a cradle plate being provided with an installation space therein for the sample to be installed and may be configured to allow the manufactured cradle plate to be replaced depending on the type and structure of the sample. In addition, alternatively, the cradle unit of the present disclosure is configured by including the cradle plate being provided with the installation space therein for the sample to be installed and the cradle plate may be configured to be coupled with the sample by a support structure which can be modified or replaced depending on type and structure of the sample. In addition, the contact bar of the present disclosure is configured as being provided at the coupling plate to be adjustably installed depending on the number and location of the busbar formed at the sample supported by the cradle unit. With this, there is an advantage that the jig of the present disclosure may be applied to various types and structures of samples.

In addition, the cradle unit may be configured with an aluminum material of which surface is treated through black anodizing. In this case, influence on the performance of the sample due to a light reflected from the surface of the cradle unit can be prevented.

In addition, in the case that the rotation support unit further includes an angle regulating device that regulates an angle of the cradle unit coupled thereto by a rotation shaft, various performance measurements can be conducted by precisely adjusting the angle of the sample. Furthermore, in the case that an angle regulating means that regulates an angle of the rotation shaft with respect to ground is further included in the rotation support unit, more various performance measurements can be conducted by rotating the sample on two axes, and the rotation support unit may have a structure that allows the sample to be rotated on three axes as necessary.

In addition, the structure of the jig may become simpler by forming the cradle unit and the contact unit integrally, and allowing adjustment of the location of the probe pin formed at the contact unit.

In addition, surfaces of the cradle unit, the contact unit and the rotation support unit may be painted or surface-treated in one of black, green, and white. In the case that the jig of the present disclosure is provided with a black surface, performance thereof can be measured by minimizing the influence due to reflection of the jig, and in the case that the jig is provided in green or white surface, measurement results reflecting the environment to which the solar photovoltaic device is applied can be obtained.

Meanwhile, a solar simulator according to another form of the present disclosure includes a light source simulating sun light; a sample jig cradling a sample for a solar photovoltaic device; and a measuring device measuring characteristics of the sample, wherein the sample jig is the jig of claim 1.

The present disclosure composed as described, by providing the jig for the sample for the solar photovoltaic device including the cradle unit that rotates at an angle equal to or greater than 180°, has an effect, with respect to the solar photovoltaic device of the bifacial light receiving type, of being able to assess the performance of a sample without reinstalling the sample in the case the light is to be received through the rear surface of the sample.

In addition, by forming the contact bar, equipped with the probe pin, with the PCB having a printed electric circuit, there is an advantage in that the contact bar can be manufactured thin, whereby influence of shade occurring during the performance measurement of the sample can be minimized and the structure becomes simple because an electric wire is not necessary for the electric connection.

In addition, by installing the probe pin to the PCB contact bar with interposition of the probe pin connecting block by soldering at the laboratory, there is an advantage in aligning the arrangement structure of the probe pin precisely and easily with electrode structures of the various samples which are to be measured.

In addition, by providing signal transmitting pads independent from each other at the front surface and back surface of the PCB contact bar, and installing the probe pins at the signal transmitting pads at the front surface or/and back surface, there is an advantage that one contact bar may be used to measure current or/and voltage characteristics as necessary.

In addition, by implementing the cradle plate or support structure which can be replaced or modified depending on the type and structure of the sample and varying the location of the probe pin depending on the busbar of the sample, there is an effect of easily implementing the jig for the various types and structures of the sample for the solar photovoltaic device.

BRIEF DESCRIPTION OF THE DRAWINGS

The above and other objects, features and other advantages of the present invention will be more clearly understood from the following detailed description when taken in conjunction with the accompanying drawings, in which.

DESCRIPTION OF SPECIFIC EMBODIMENTS

An exemplary embodiment of the present disclosure will be described in detail with reference to the accompanying drawings. Since description of a disclosed technology is merely an embodiment for the structural or functional description, claims of the disclosed technology should not be understood to be limited by the embodiment described in the specification. That is, since the embodiment may have various modifications and many kinds of types, the claims of the disclosed technology should be understood to include equivalents that can materialize technical concepts.

Meanwhile, meanings of the terms described in the present application should be understood as follows.

Since terms such as "first" and "second" are used merely to differentiate one component from another, claims should not be limited by these terms. For example, a first component can be named as a second component and similarly, a second component can also be named as a first component.

Figure 1:
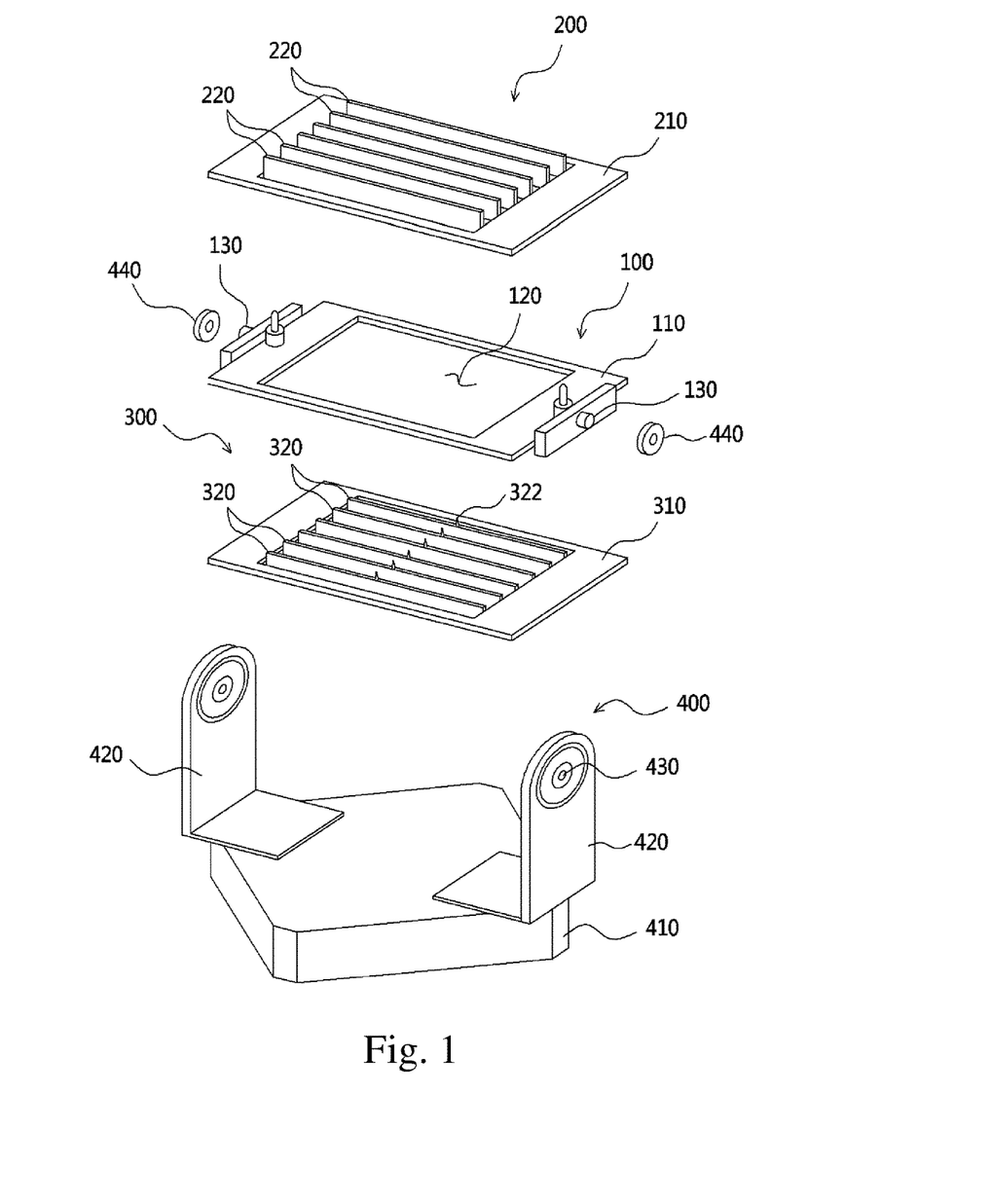
FIG. 1 is a drawing illustrating a jig for a sample for a solar photovoltaic device according to an embodiment of the present disclosure.

FIG. 1 is a drawing illustrating a jig for a sample for a solar photovoltaic device according to an embodiment of the present disclosure.

The jig for the sample for the solar photovoltaic device according to the embodiment includes a cradle unit 100, a contact unit 200 and/or 300, and a rotation support unit 400.

The cradle unit 100 is a part where a sample for the solar photovoltaic device is installed and supported. The cradle unit 100 includes a cradle plate 110 having an installation space 120 therein in which the sample for the solar photovoltaic device is located.

Figure 2A:
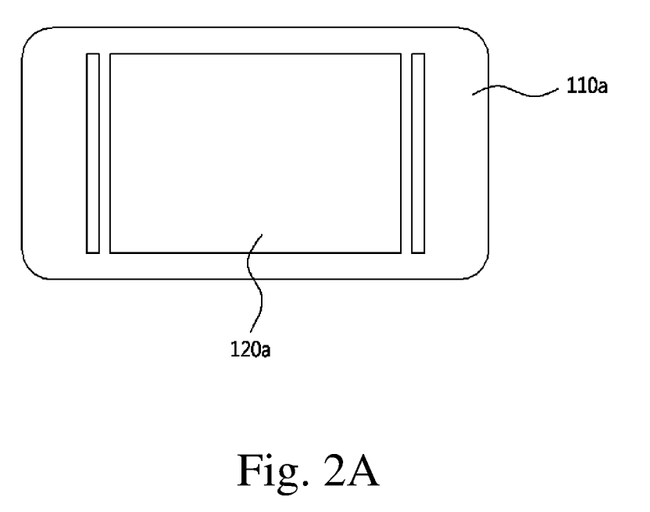
FIGS. 2A and 2B are drawings illustrating embodiments of a cradle plate according to the present disclosure.
Figure 2B:
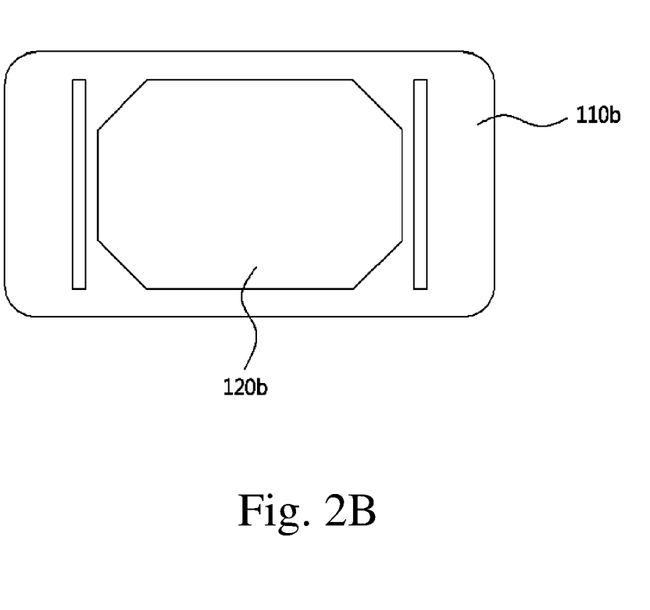

The installation space 120 is a space locating the sample for the solar photovoltaic device, and as it uses the cradle plate 110 being individually manufactured by adjusting the shape of the installation space 120 and supporting structure with the sample, the cradle plate 110 can be replaced depending on the sample. In FIGS. 2A and 2B, exemplary embodiments are illustrated for the cradle plates usable by replacement depending on the type and structure of the sample. More specifically, in order to measure a polycrystalline silicon solar cell, as illustrated in FIG. 2A, a cradle plate 110*a* in which a rectangular installation space 120*a* is provided can be used. In addition, in order to measure a monocrystalline silicon solar cell, as illustrated in FIG. 2B, a cradle plate 110*b* in which an octagonal installation space 120*b*, which is a type of a rectangle having four corners thereof cut off, is provided may be used. Furthermore, the installation space 120 further includes support structures to fix the sample at the installation space 120 wherein the support structures may be modified in accordance with the type and structure of the sample.

Figure 3A:
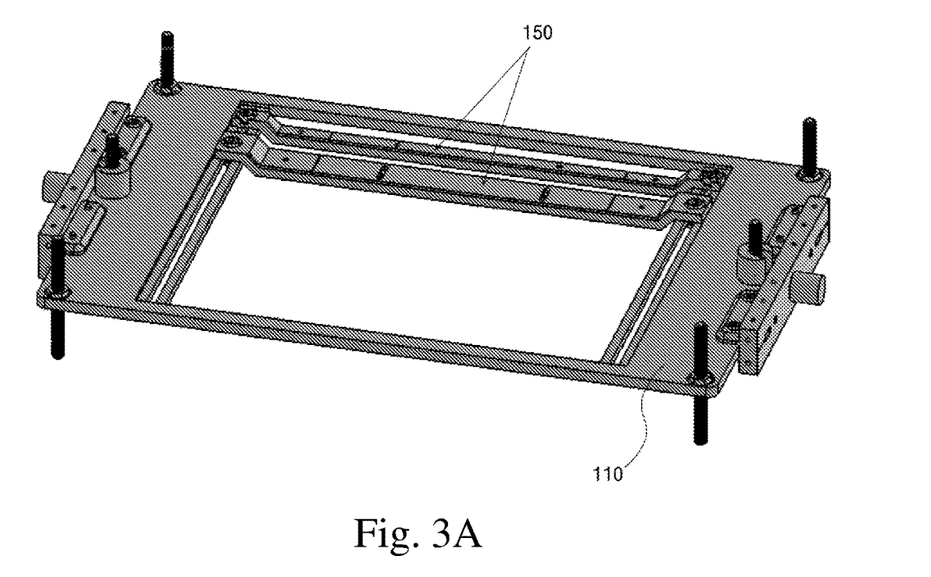
FIG. 3A is an exemplary drawing illustrating a state where the supporting structure is installed at the cradle plate to cradle a sample according to an embodiment of the present disclosure.
Figure 3B:
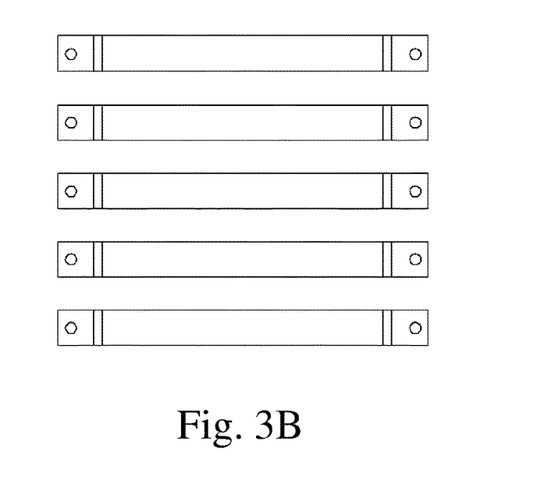
FIGS. 3B and 3C are drawings illustrating embodiments of combining various supporting structures depending on a type and a structure of a sample.
Figure 3C:
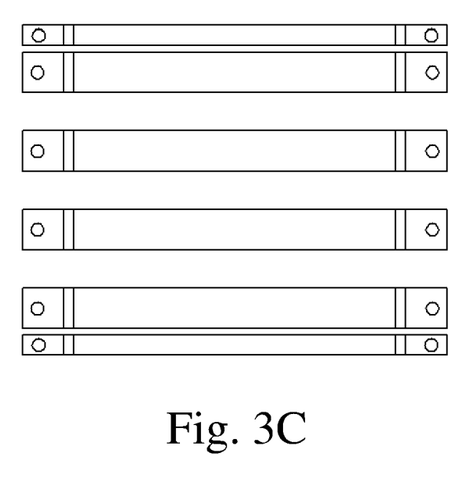

As another type of the cradle plate 110, the cradle plate 110 where the sample for the solar photovoltaic device is installed in the installation space 120 can include a separate support manufactured individually depending on the type and detailed structure of the sample, or appropriately adjustable to the sample. In the case, the installation space 120 can be adjusted depending on the sample by means of replacing or modifying the support structure only on the same cradle plate 110. Selectively, a support structure 150 as illustrated in FIGS. 3A to 3C can be used. FIG. 3A illustrates an exemplary state where two of the support structures 150 are installed on the cradle plate 110. As illustrated, the support structures of a rod-like shape having various sizes of width are manufactured and may be used in various combinations depending on the structure of the busbar of the solar cell. For example, FIG. 3B illustrates an implementation form in combination of a plurality of support structures having same width to be appropriate for a four busbar solar cell, and FIG. 3C illustrates an implementation form in combination of a plurality of support structures having two kinds of different widths appropriate for a three busbar solar cell.

As described above, a measuring jig of the present disclosure has an advantage of easily being applied to the sample for the solar photovoltaic device having various types and structures by adopting the cradle plate or support structures which can be replaced or modified depending on the type and structure of the sample.

Meanwhile, a rotation shaft 130 is formed at the side of the cradle plate 110 and this rotation shaft 130 allows the cradle plate 110 being coupled with a rotation support unit 400 to be able to rotate.

The cradle plate 110 uses an aluminum having surface treatment through anodizing and adjusts a surface reflectance of the cradle plate 110 by adjusting surface color. Specifically, by adjusting the surface reflectance of the aluminum by adjusting a process of black surface treatment expressed as black anodizing, the influence that the surface reflectance of the cradle plate 110 mounted with the sample has on the performance of the solar photovoltaic device can be minimized.

Next, as the contact unit of the present disclosure, the upper and lower contact portions 200 and 300 will be described. The contact portions of the present disclosure consist of coupling plates 210 and 310 being coupled with the cradle unit 100, and contact bars 220 and 320 being connected to the coupling plates and having probe pins being arranged and fixed to be aligned with busbars of the sample. For the sake of simple description, in an embodiment of FIG. 1, to be appropriate to the measurement of the solar cell of bifacial light receiving type, the case is illustrated that the contact unit consists of the upper contact portion 200 and the lower contact portion 300. Hereinafter, composition of the contact unit is to be described on the basis of the embodiment of FIG. 1; however, a measuring jig of the present disclosure includes not only the case where the contact unit is provided at the top and bottom of the jig as the upper and lower contact portions 200 and 300, respectively, but also the case where the contact unit is provided at one side only.

As illustrated in FIG. 1, the upper contact portion 200 is coupled at the upper position of the cradle unit 100, includes the upper contact bar 220, and includes the upper coupling plate 210 coupled with the cradle unit 100 and installed with the upper contact bar 220. The upper contact bar 220 connected to the upper coupling plate 210 includes at least one probe pin (not shown) coming into contact with the busbar which is an electrode positioned at the surface of the sample.

In addition, the lower contact portion 300 is coupled at the lower position of the cradle unit 100, includes the lower contact bar 320, and includes the lower coupling plate 310 coupled with the cradle unit 100 and installed with the lower contact bar 320. The lower contact bar 320 connected to the lower coupling plate 310 includes at least one probe pin 322 coming into contact with the busbar which is an electrode positioned on the surface of the sample.

The upper coupling plate 210 and the lower coupling plate 310 have vacant spaces in the middle to install the upper contact bar 220 and the lower contact bar 320, a plurality of upper and lower contact bars 220 and 320 is installed spaced apart from each other and light penetrates through the spaces between the upper contact bars 220 and through the spaces between the lower contact bars 320. This embodiment illustrates the case that the upper coupling plate 210 is provided with six upper contact bars 220 and the lower coupling plate 310 is provided with six lower contact bars 320. However, it should be understood that the number and location of the contact bars of the upper coupling plate 210 and the lower coupling plate 310 may be changed depending on the number and location of the busbars formed on the sample without being limited to the above-mentioned embodiment.

Figure 4:
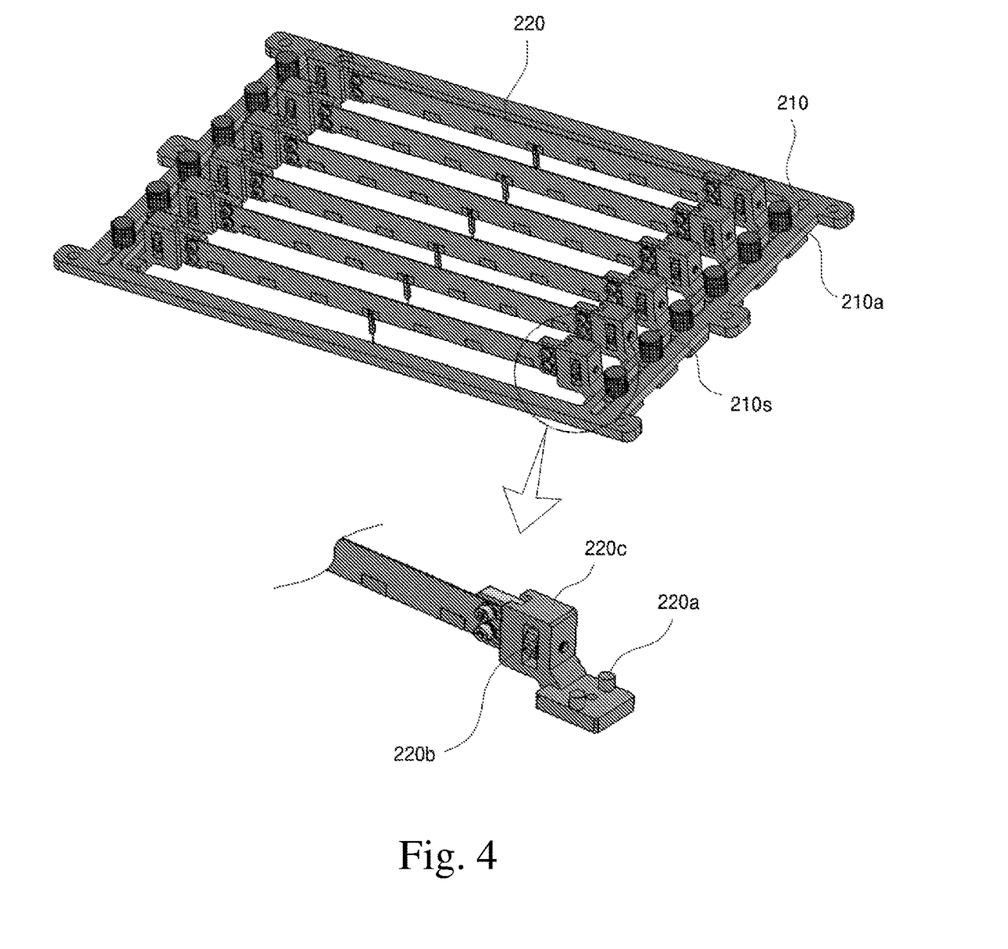
FIG. 4 is a drawing illustrating a structure to install contact bars by adjusting the number and location thereof at a coupling plate, at a contact unit of the jig for the sample according to the present disclosure.

An exemplary embodiment of a structure to install the upper contact bar 220, by adjusting the number and location thereof, at the upper coupling plate 210 is illustrated in FIG. 4. As illustrated, the present disclosure adopted a structure 220c as a configuration to adjust the location and number of the contact bars to be connected to the coupling plate, wherein the structure 220c is provided at the opposite end parts of the contact bar 220 and connects the contact bar to the coupling plate. In addition, a slit 210s is provided at both sides of the coupling plate 210 to provide a path to allow the structure 220c to be able to move by sliding. Specifically, at the structure 220c, a protuberance 220a, moving by sliding along the slit 210s provided at the opposite side parts of the coupling plate, and a knob 220b to adjust horizontal position of the contact bar 220 connected by insertion to the inside of the structure 220c can be provided.

By using the embodiment, a method of adjusting the location of the contact bar 220 to the coupling plate 210 will be described. First, insertion of the protuberance 220a of the structure 220c coupled with the contact bar 220 into the slit 210s from the lower part of the coupling plate 210 is established, and then, in the current state, adjustment of the location of the contact bar 220 is performed by sliding the structure 220c depending on the location of the busbar of the sample. Once the location of contact bar is determined as above, the adjusted location of the contact bar is fixed by fastening a binding knob 210a for the location of the contact bar through the protuberances 220a of the structure 220c from the upper position of the coupling plate. In addition, the number of contact bars 220 to be coupled with the coupling plate 210 may be adjusted by coupling the number of contact bars corresponding to the number of the busbars of the sample with the coupling plate according to the method described above.

Furthermore, the upper contact bar 220 and the lower contact bar 320 are equipped with probe pins 322 coming into contact with the busbar of the sample. Though the case of one probe pin is illustrated in the present embodiment, a number of the probe pins equal to or greater than one can be installed as necessary. Specific setup to install the probe pin at the contact bar will be described later.

Meanwhile, the upper contact bar 220 and the lower contact bar 320 can be composed of a printed circuit board (PCB) which has a printed circuit to electrically connect the probe pin with the outside. By forming the upper contact bar 220 and the lower contact bar 320 with the PCB, the upper contact bar 220 and the lower contact bar 320 can be manufactured thin, whereby there is an advantage that formation of shade on the sample by components consisting the upper contact bar and the lower contact bar can be minimized and an electric wire is not necessary for the electric connection.

Figure 5:
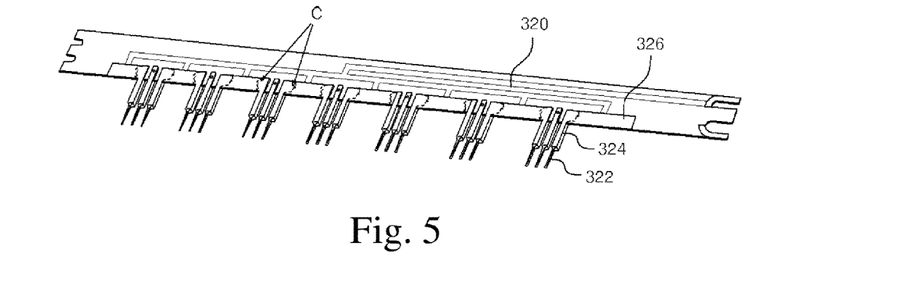
FIG. 5 is a drawing illustrating a structure where probe pins are arranged and fixed on a contact bar of a contact unit of the jig for the sample according to an embodiment of the present disclosure.

In FIG. 5, a structure is illustrated where the probe pin 322 is arranged and fixed to the lower contact bar 320 according to the embodiment of the present disclosure. As illustrated, at the lower contact bar 320 composed of the PCB, each of one or more probe pins 322 can be arranged and fixed with interposition of each probe pin connecting block 324. More specifically, at the lower contact bar 320, an electric signal transmitting pad 326 is installed to transmit a signal from the probe pin to the circuit of the PCB contact bar and the probe pin is installed on the lower contact bar 320 by means of coupling the probe pin connecting block 324 equipped with the probe pin to the electric signal transmitting pad 326 by soldering (C). At this time, the probe pin connecting block 324 is fixed on the predetermined location of the electric signal transmitting pad 326 by soldering, thereby allowing the probe pin 322 connected thereto to be aligned with the busbar of the sample of the solar cell.

Figure 6:
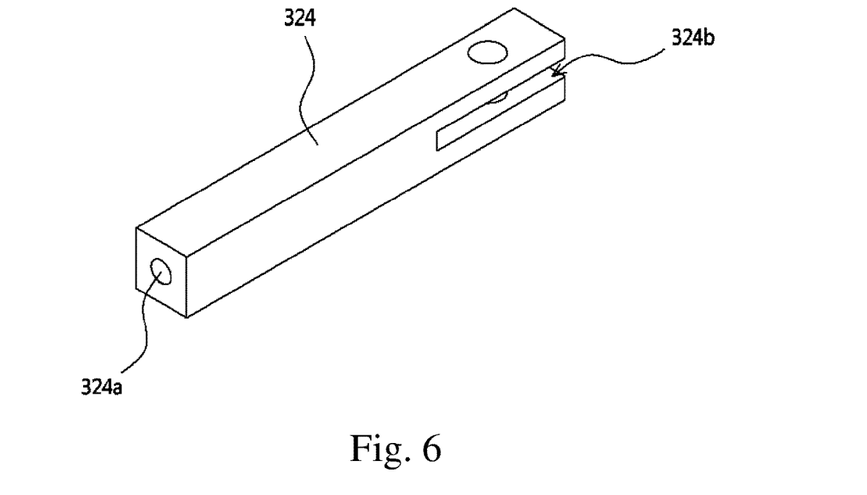
FIG. 6 is a drawing illustrating a probe pin connecting block to connect the probe pin to a contact bar according to an embodiment of the present disclosure.

FIG. 6 illustrates a structure of the probe pin connecting block 324 having been applied to the embodiment of FIG. 5. The probe pin connecting block 324 according to the embodiment of the present disclosure, as illustrated in FIG. 6, can be formed in a rod-like shape (or an arbitrary shape similar to this). In addition, the probe pin connecting block 324 can be provided with, at one end thereof, a hole 324a to allow the probe pin to be inserted into the hole, and, at an opposite end thereof, a connection part 324b to be connected to the electric signal transmitting pad 326 of the contact bar by soldering to be electrically connected with the contact bar 320.

The probe pin connecting block 324 and the electric signal transmitting pad 326 according to the embodiment of the present disclosure may be composed of a high conductivity metal material which can be selected from, but not specially limited to, a metal such as aluminum and copper or a metal material such as aluminum and copper of which surface is coated with gold. As described above, as the probe pin and the PCB contact bar are configured to be easily connected with interposition of the probe pin connecting block by soldering at the laboratory, compared with a conventional structure mass-produced in a form of the probe pin embedded in the contact bar of metal material, there is an advantage that alignment of the arrangement structure of the probe pins can be precisely and easily performed at a laboratory with electrode structures of the various samples which are to measure.

In describing the embodiment of FIGS. 5 and 6 above, for the sake of simple description, the case was described that the probe pin 322 was installed on the lower contact bar 320; however, the same configuration can be applied to the upper contact bar 220. In addition, for a measuring jig equipped with only one contact unit, not separated into the upper and lower contact portions, the contact bar is configured the same as above and the probe pin can be arranged and fixed by the same manner.

Figure 7:
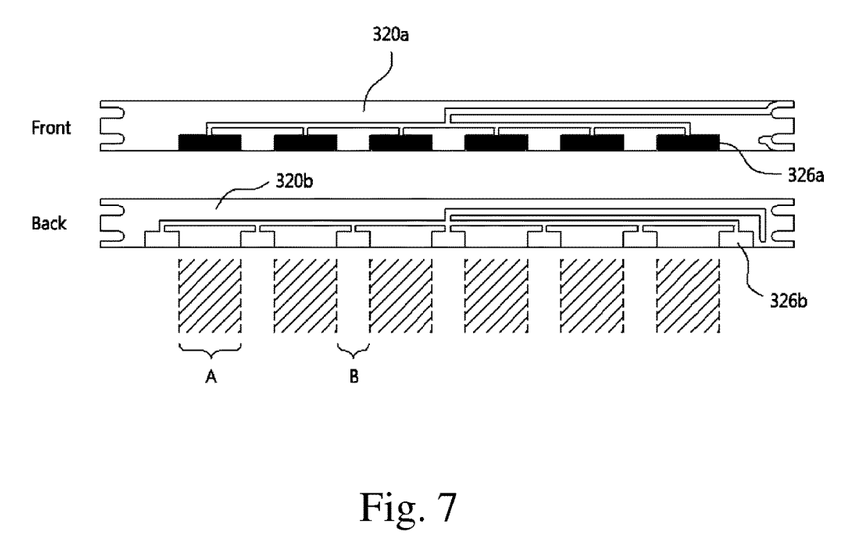
FIG. 7 is a drawing illustrating a circuit configuration of front and back sides of a printed circuit board (PCB) type contact bar according to an embodiment of the present disclosure.

Meanwhile, the upper or lower contact bar of the measuring jig according to the present disclosure, by installing groups of electric signal transmitting pads independent from each other at a front surface and a back surface, can be configured to transmit independent electric signals through the front surface and the back surface of the upper or lower contact bar. FIG. 7 illustrates exemplary type and circuit structure of the PCB type contact bar, wherein the groups of electric signal transmitting pads are installed on the front surface and the back surface of the PCB type contact bar according to the present disclosure.

As illustrated in FIG. 7, the contact bar can be configured such that, a first electric signal transmitting pad 326a is installed on a front surface 320a of the contact bar and a second electric signal transmitting pad 326b is installed on a back surface 320b of the contact bar and then the first electric signal transmitting pad 326a receives a first signal of the sample output from the probe pin connected thereto and transmits the signal to a circuit of the front surface, and the second electric signal transmitting pad 326b receives a second signal which is output from the probe pin connected thereto and is an electric signal different from the first signal, and transmits the second signal to a circuit of the back surface. At this time, the probe pin, in order to be aligned with a busbar structure of the sample to be measured, is connected by soldering to the first electric signal transmitting pad or the second electric transmitting pad. For example, the first electric signal transmitting pad 326a can be used for transmitting the current signal and the second electric signal transmitting pad 326b can be used for transmitting the voltage signal. In this case, if a probe pin connecting block is installed on a section A illustrated by slashed lines in FIG. 7, a corresponding probe pin functions as a current signal transmitting probe, and if a probe pin connecting block is installed on a non-slashed section B, a corresponding probe pin functions as a voltage signal transmitting probe.

Like this, by providing signal transmitting pads independent from each other at the front surface and back surface of the PCB contact bar and installing the probe pins at the signal transmitting pads of the front surface or/and back surface, there is an advantage of using one piece of the contact bar to measure characteristics of current or/and voltage as necessary.

In addition, for the cases of the upper coupling plate 210 and the lower coupling plate 310, and the upper contact bar 220 and the lower contact bar 320, an aluminum of which surface reflectance is adjusted through the surface treatment with black anodizing is used and the influence that light reflected from the surfaces of components composing the upper contact portion 200 and the lower contact portion 300 has on the performance of the solar photovoltaic device can be minimized.

As described above, the jig for the sample for the solar photovoltaic device according to the present disclosure is configured for the upper contact portion 200 and/or the lower contact portion 300 equipped with probe pins coming into contact with the busbar of the sample to be coupled with the cradle unit 100 at which the sample is installed. In addition, the jig further includes the rotation support unit 400 to be appropriate to the measurement of the solar photovoltaic device of bifacial light receiving type wherein sunlight is incident on both of the upper and lower surfaces of the device.

Referring to FIG. 1 again, the rotation support unit 400 includes a support base 410, and a cradle bracket 420 is erected on the support base 410 wherein the cradle bracket 420 includes a rotation hole 430 to which the rotation shaft 130 formed at the cradle plate 110 is coupled. A bearing 440 is installed between the rotation shaft 130 and the rotation hole 430. Since the cradle unit 100 coupled with the rotation support unit 400 by the rotation shaft 130 can rotate at an angle equal to or greater than 180°, directions of the upper and lower surfaces can be reversed and measurement can be performed for the lower surface of the sample for the solar photovoltaic device of bifacial light receiving type by rotating the cradle unit 100 being coupled with the upper contact portion 200 and the lower contact portion 300 at an angle of 180°.

Furthermore, since the jig for the sample for the solar photovoltaic device can rotate the sample, an incident angle with respect to a light source can be adjusted by adjusting a rotation angle of the sample. As a result, compared with the conventional case in which the position of the light source has to be moved for measuring the performance according to the incident angle, since the jig of the present disclosure can change the angle of the sample, the incident angle can be more variously adjusted. To do this, an angle adjusting device which can precisely adjust the angle of the sample is provided.

Figure 8:
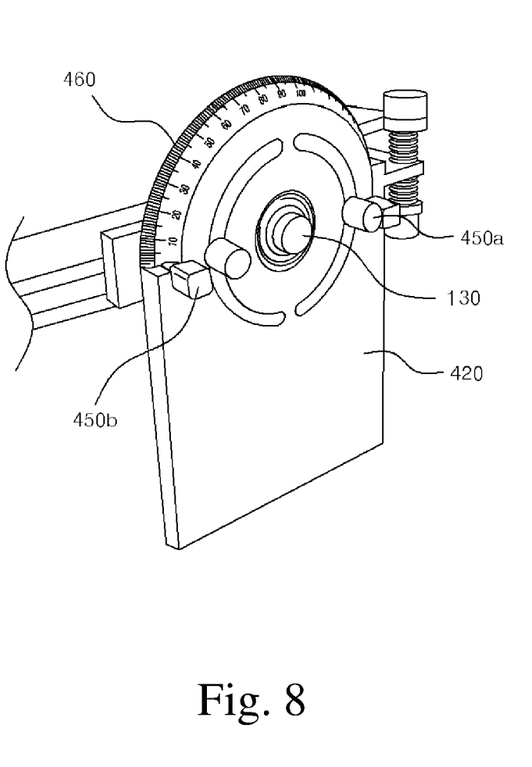
FIG. 8 is a drawing illustrating an embodiment of a rotation angle adjusting device provided at a rotation support unit of the jig for the sample according to an embodiment of the present disclosure.

FIG. 8 illustrates a set-up of an angle adjusting device according to the present embodiment. As illustrated, the angle adjusting device according to the present disclosure is installed on the cradle bracket 420 of the rotation support unit 400 and may include a scale marking unit 460 to confirm an angle of the cradle plate 110, and an angle adjusting knob 450a which can fix after rotating the cradle plate at a desired angle, coupled with the cradle plate. Furthermore, to realize easy adjustment of the cradle plate to a horizontal position, the angle adjusting device may further include a horizontal level fixing block 450b which can be in a locked state by being fastened to the cradle bracket 420 only when the cradle plate is in the horizontal position.

Meanwhile, although the present embodiment illustrates the case that the rotation shaft 130 of the cradle unit 100 and the rotation hole 430 of the rotation support unit 400 are fixed horizontally with respect to ground, the present invention may be altered to adjust the aligning angle of the rotation shaft 130 by another manner, for example, by changing a slope of the support base 410, and an angle of the sample can be adjusted in a state that a light source is fixed through a structure that the sample rotates on two- or three-axes.

Until now, the embodiment has been described such that by installing the upper contact bar and the lower contact bar manufactured with the PCB at the upper coupling plate and the lower coupling plate, respectively, and coupling the upper coupling plate and the lower coupling plate with the cradle unit at which the sample is installed, the probe pins equipped in the upper contact bar and the lower contact bar contacts the busbar of the sample. However, the structure that allows the probe pin equipped in the upper contact bar and the lower contact bar to contact the busbar of the sample is not limited to this.

For example, by providing, at the cradle plate of the cradle unit, an installation structure at which the upper contact bar and the lower contact bar can be installed, the upper contact bar and the lower contact bar composed of the PCB can be directly connected to not the upper coupling plate and the lower coupling plate but the installation structure formed at the cradle plate.

Furthermore, in addition to the angle adjustment of the cradle unit 100 by the rotation hole 430 and the rotation shaft 130, by providing, at the support base 410 or the cradle bracket 420, a location adjustment means capable of moving the support base 410 itself or the cradle bracket 420 and adjusting the location of the cradle unit 100, a relative location of the sample installed in the cradle unit 100 with respect to a light source can be adjusted. At this time, the location adjustment means may be able to move the support base 410 itself or the cradle bracket 420 in triaxial directions of x, y, and z, and to precisely adjust a location by applying a length adjustment structure such as a handle of a micrometer converting a rotary motion of a screw into a rectilinear motion.

Meanwhile, until now, a structure has been described for the case of using an aluminum of which surface is treated through black anodizing to minimize a light reflected from the jig for the sample for the solar photovoltaic device. In order to measure an objective performance of the sample, though minimization of a reflectance due to the jig is preferable, as a method to reflect the effect of an environment under which the solar photovoltaic device is used, component composing the jig can be applied according to an applicable test environment by changing the color thereof or reflectance thereof. Specifically, surface treatment can be implemented for a component composing the jig by painting in a color existing much around an applicable test environment, e.g. green color of a forest or white color of desert, or coating for a surface thereof to have a surface reflectance corresponding to that of a surrounding environment.

A solar simulator according to another embodiment of the present disclosure comprises a light source simulating sun light, a sample jig cradling a sample for the solar photovoltaic device; and a measuring device measuring a characteristic of the solar photovoltaic device, wherein the sample jig is the jig for the sample for the solar photovoltaic device described earlier.

In the solar simulator according to the present disclosure, the rest components except the sample jig, that is, the light source and the measuring device, can be adopted without any limitation, and a detailed description thereof is omitted.

Up to now, the present disclosure has been described through an exemplary embodiment. However, the exemplary embodiment is merely to aid in the understanding of the technical concept of the present disclosure, and those skilled in the art will appreciate that various modifications, additions and substitutions are possible, without departing from the scope and spirit of the present disclosure. Accordingly, scope of protection of the present disclosure should be interpreted not by a specific embodiment but by those described in claims. In addition, it should be interpreted that all technical concepts within the equivalent range of the claims are included in the scope of right of the present disclosure.

The invention claimed is:

1. A jig for a sample for a solar photovoltaic device, the jig comprising:
    a cradle unit supporting the sample for the solar photovoltaic device; and
    a contact unit including at least one probe pin coming into contact with a busbar of the sample located at the cradle unit,
    wherein the contact unit includes:
        a coupling plate coupled with the cradle unit; and
        at least one contact bar composed of a PCB (Printed Circuit Board) and being connected to the coupling plate, the contact bar having the at least one probe pin arranged and fixed at the contact bar to be aligned with the busbar of the sample with interposition of at least one probe pin connecting block,
    the jig further comprising:
    a rotation support unit coupled with the cradle unit by a rotation shaft so as to allow the cradle unit to be rotated at an angle equal to or greater than 180% so that upper and lower surfaces of the sample supported by the cradle unit are reversed.

2. The jig of claim 1, wherein the probe pin connecting block is provided with a hole at one end thereof to allow the probe pin to be inserted into the hole, and a connection part at an opposite end thereof to be electrically connected with the contact bar.

3. The jig of claim 2, wherein, at the contact bar, at least one electric signal transmitting pad is installed to transmit a signal from the probe pin to a circuit of the contact bar, and the connection part of the probe pin connecting block is connected to a desired location of the electric signal transmitting pad by soldering in order to adjust a position of the probe pin on the contact bar.

4. The jig of claim 3, wherein, at a front surface of the contact bar, at least one first electric signal transmitting pad is provided and at a back surface thereof, at least one second electric signal transmitting pad is provided,
    wherein the first electric signal transmitting pad receives a first signal of the sample output from the probe pin connected thereto and transmits the first signal to a circuit of the front surface, and
    the second electric signal transmitting pad receives a second signal which is output from the probe pin connected thereto and is an electric signal different from the first signal, and transmits the second signal to a circuit of the back surface.

5. The jig of claim 4, wherein the first signal and the second signal each are a current signal or a voltage signal.

6. The jig of claim 1, wherein the cradle unit includes a cradle plate being provided with an installation space for the sample and being configured to be replaced depending on type and structure of the sample.

7. The jig of claim 1, wherein the cradle unit includes a cradle plate being provided with an installation space for the sample, the cradle plate being coupled with the sample by a structure which can be modified or replaced depending on type and structure of the sample.

8. The jig of claim 1, wherein the sample is a bifacial light receiving type sample, and the contact unit includes an upper contact portion contacting with an upper busbar of the bifacial light receiving type sample and a lower contact portion contacting with a lower busbar of the bifacial light receiving type sample.

9. The jig of claim 1, wherein the rotation support unit includes an angle adjusting device that regulates an angle of the cradle unit coupled thereto by the rotation shaft.

10. The jig of claim 1, wherein the contact bar is provided at the coupling plate to be controlled depending on the number and location of the busbar formed at the sample supported by the cradle unit.

11. The jig of claim 1, wherein the cradle unit is made of an aluminum material of which a surface is treated through black anodizing.

12. The jig of claim 1, wherein surfaces of the cradle unit, the contact unit and the rotation support unit are surface-treated or painted in one of black, green, and white.

13. A solar simulator, the simulator comprising:
    a light source simulating sun light;
    a sample jig cradling a sample for a solar photovoltaic device; and
    a measuring device measuring characteristics of the sample,
    wherein the sample jig is the jig of claim 1.

* * * * *